(12) United States Patent
Ho

(10) Patent No.: US 6,562,656 B1
(45) Date of Patent: May 13, 2003

(54) CAVITY DOWN FLIP CHIP BGA

(75) Inventor: Chung W. Ho, Hsinchu (TW)

(73) Assignee: Thin Film Module, Inc., Hsin-Chu (TW)

( * ) Notice: Subject to any disclaimer, the term of this patent is extended or adjusted under 35 U.S.C. 154(b) by 104 days.

(21) Appl. No.: 09/888,258

(22) Filed: Jun. 25, 2001

(51) Int. Cl.$^7$ .................. H01L 21/44; H01L 21/48

(52) U.S. Cl. .............. 438/107; 438/108; 438/118; 438/121; 438/125

(58) Field of Search ................. 438/106–108, 438/117, 118, 121, 123, 124, 125; 257/737, 738, 778, 705, 710, 718, 730

(56) References Cited

U.S. PATENT DOCUMENTS

| | | | |
|---|---|---|---|
| 5,289,337 A | 2/1994 | Aghazadeh et al. | 361/718 |
| 5,578,869 A | 11/1996 | Hoffman et al. | 257/691 |
| 5,583,378 A | 12/1996 | Marrs et al. | 257/710 |
| 5,629,835 A * | 5/1997 | Mahulikar et al. | 361/719 |
| 5,777,386 A | 7/1998 | Higashi et al. | 257/737 |
| 5,874,321 A | 2/1999 | Templeton, Jr. et al. | 438/107 |
| 5,895,967 A * | 4/1999 | Stearns et al. | 257/691 |
| 5,919,329 A * | 7/1999 | Banks et al. | 156/281 |
| 6,020,637 A | 2/2000 | Karnezos | 257/738 |
| 6,124,637 A * | 9/2000 | Freyman et al. | 257/736 |
| 6,165,885 A * | 12/2000 | Gaynes et al. | 438/612 |
| 6,165,980 A * | 12/2000 | Cozzi et al. | 514/19 |
| 6,221,693 B1 * | 4/2001 | Ho | 438/108 |
| 6,365,980 B1 * | 4/2002 | Carter et al. | 257/787 |
| 2002/0098617 A1 * | 7/2002 | Lee et al. | 438/106 |
| 2002/0180040 A1 * | 12/2002 | Camenforte et al. | 257/738 |

* cited by examiner

*Primary Examiner*—Michael S. Lebentritt
(74) *Attorney, Agent, or Firm*—George O. Saile; Stephen B. Ackerman

(57) ABSTRACT

The process of the invention starts with a metal panel, overlying the metal panel is created an interconnect substrate making use of BUM and thin film processing technology while the process of the invention enables the use of stacked vias and merged vias for the connection of the flip chip bumps. The process of the invention creates, for instance, two patterned layers on the surface of the metal panel whereby the metal panel is used as the ground terminal of the power supply. The first layer that is created on the surface of the metal panel can be the power supply layer (this layer can also be used for some fan-out interconnect lines), the second layer that is created on the surface of the metal panel is primarily used for (fan-out) interconnect lines. The flip chip bumps are, under the process of the invention, connected to the second layer of the interconnect substrate. Where the BGA balls also reside on the same surface as the flip chip bumps, the process of the invention does not require any additional structures such as a dam for the containment of insulating encapsulation material (underfill) that at times is provided around a perimeter of a well into which a flip chip is inserted, making the process of the invention most cost effective.

26 Claims, 13 Drawing Sheets

FIG. 1 — Prior Art

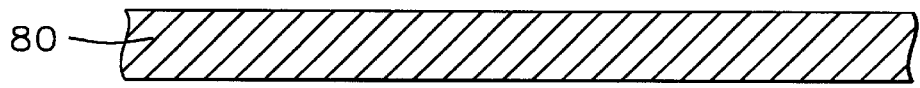
FIG. 3a – Prior Art
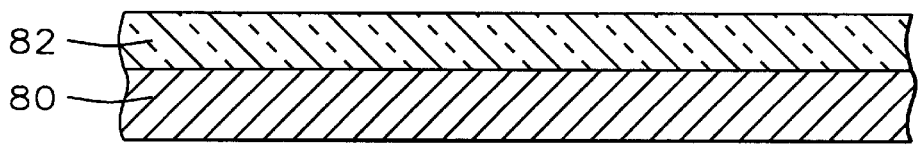
FIG. 3b – Prior Art
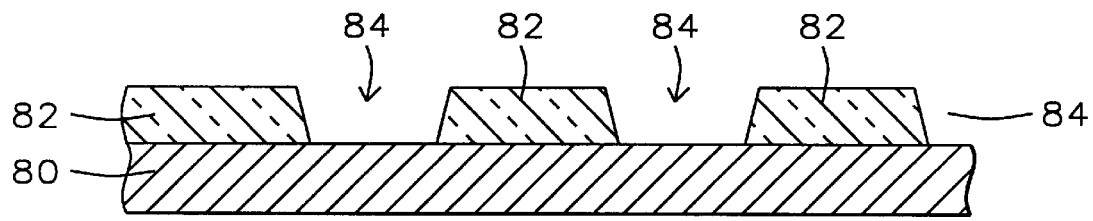
FIG. 3c – Prior Art
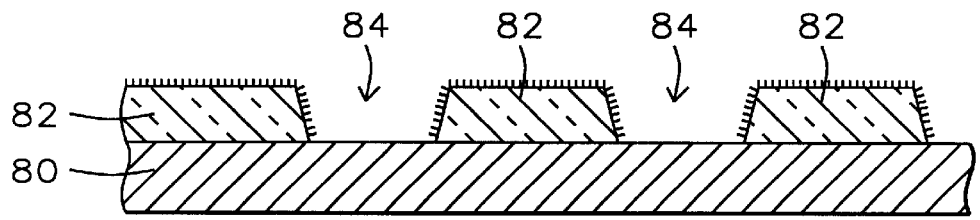
FIG. 3d – Prior Art
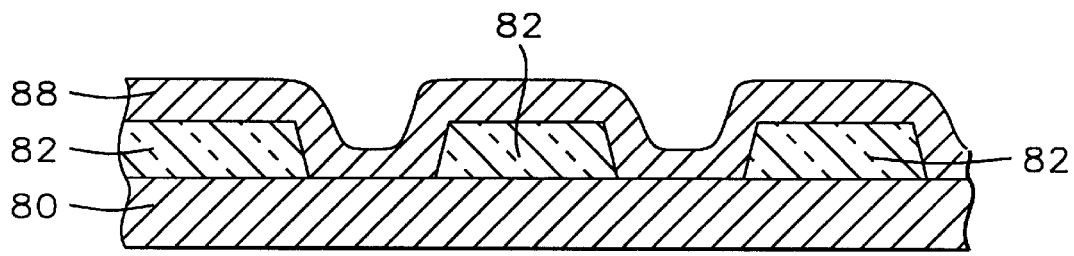
FIG. 3e – Prior Art

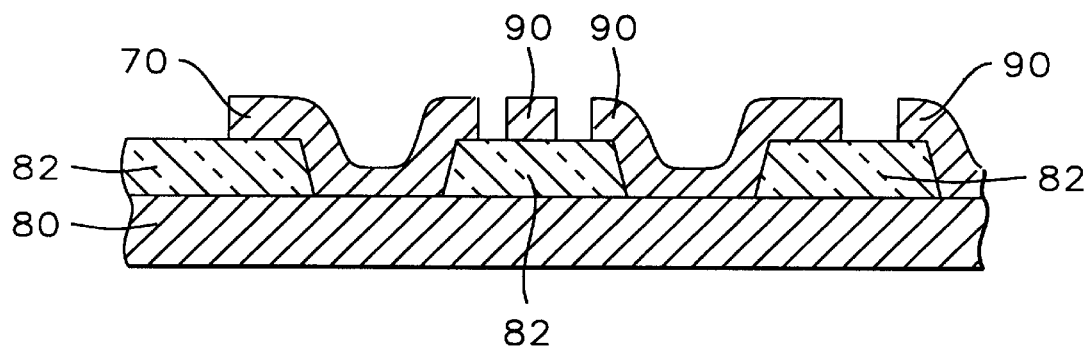
FIG. 3f - Prior Art
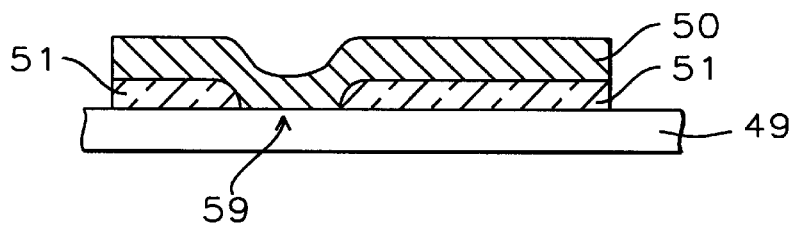
FIG. 4a - Prior Art
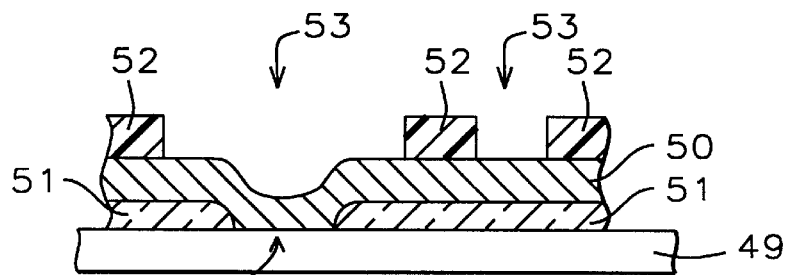
FIG. 4b - Prior Art
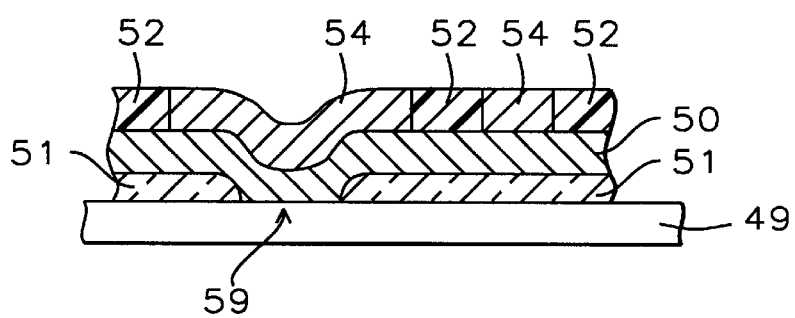
FIG. 4c - Prior Art

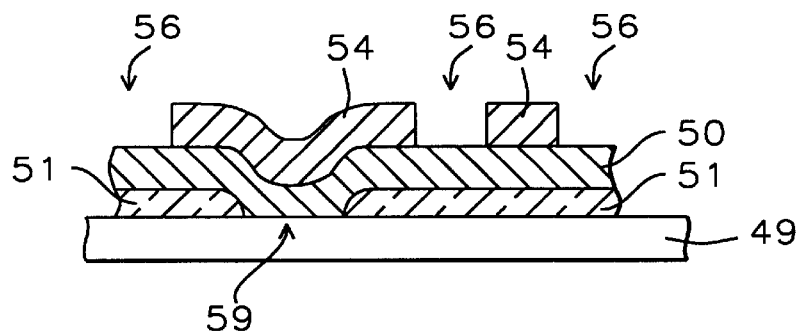
FIG. 4d – Prior Art
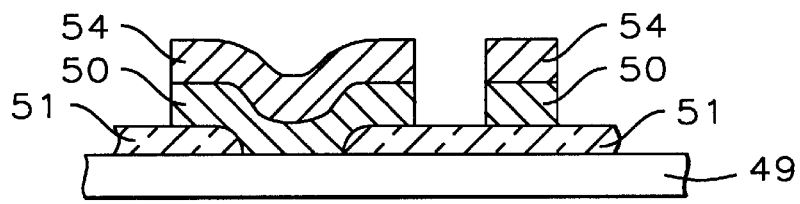
FIG. 4e – Prior Art
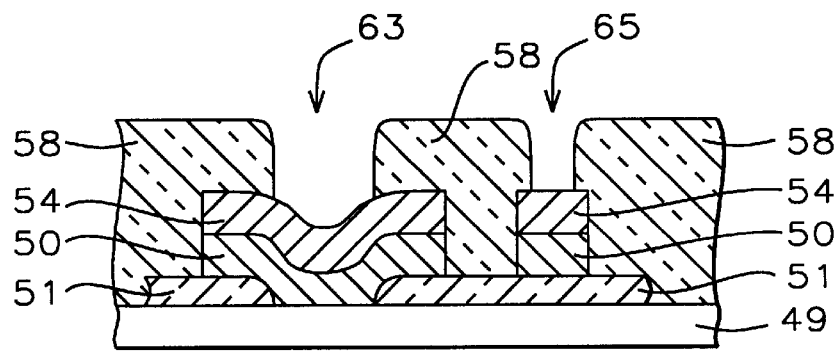
FIG. 4f – Prior Art
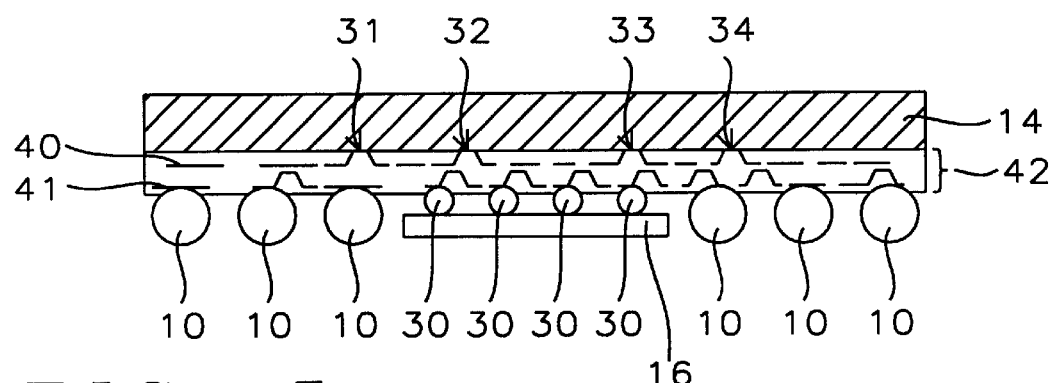
FIG. 5

CAVITY DOWN FLIP CHIP BGA

This application is related to Ser. No. 09/332,427 filed on 06/14/99 assigned to a common assignee.

BACKGROUND OF THE INVENTION (1) Field of the Invention

The invention relates to the fabrication of integrated circuit devices, and more particularly, to a method for creating a cavity down flip chip package.

(2) Description of the Prior Art

The semiconductor industry is known to be very competitive and is therefore constantly driven to improve semiconductor device performance at competitive prices. The objective of improving device performance can realistically only be achieved by reducing device dimensions, which leads to increased device densities. Devices of increased densities must further be combined to form multi-chip packages that contain not only the high-density semiconductor devices but also contain relatively complex means for the interconnection of the devices that are part of the package.

In many of the complex, multi-device packages a substrate, that is typically ceramic or plastic based, is used for the mounting of devices on the surface thereof and for the formation of the interconnect-interface between the devices and the surrounding circuitry. Many different approaches are used for the purpose of interconnecting multiple semiconductor devices, such as Dual-In-Line packages (DIP's), Pin Grid Arrays (PGA's), Plastic Leaded Chip Carriers (PLCC's) and Quad Flat Packages (QFP's). Multi layer structures have further been used to connect physically closely spaced integrated circuits with each other. Using this technique, a single substrate serves as an interconnect medium, multiple chips are connected to the interconnect medium forming a device package with high packaging density and dense chip wiring. The chip wiring contains layers of interconnect metal that are interconnected with interconnect vias, layers of dielectric (such as polyimide) or insulating layers separate metal layers that make up the interconnect network and the via and contact points that establish connections between the interconnect networks. The design of overlying and closely spaced interconnect lines are subject to strict rules of design that are aimed at improving package performance despite the high density packaging that is used. For instance, electrical interference between adjacent lines is minimized or avoided by creating interconnect lines for primary signals that intersect under 90 degree angles. Surface planarity must be maintained throughout the construction of multi-layer chip packages due to requirements of photolithography and package reliability. Many of the patterned layers within a layered structure form the base for overlying layers, lack of planarity can therefore have a multiplying effect on overlying layers.

The Quad Flat Package (QFP) has been created to achieve high pin count integrated packages with various pin configurations. The pin I/O connections for these packages are typically established by closely spaced leads distributed along the four edges of the flat package. This limits the I/O count of the packages and therefore the usefulness of the QFP. The Ball Grid Array (BGA) package has been created whereby the I/O connects for the package are distributed around the periphery of the package and over the complete bottom of the package. The BGA package can therefore support more I/O points and provides a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

Where circuit density keeps increasing and device feature size continues to be reduced, the effect of the interconnect metal within the package becomes relatively more important to the package performance. Factors that have a negative impact on circuit performance, such as interconnect line resistance, parasitic capacitance, RC-delay constants, crosstalk and contact resistance have a significant impact on the package design and its limitations. A significant power drop may for instance be introduced along the power and ground buses where the reduction of the interconnect metal does not match the reduction in device features. Low resistance metals (such as copper) are therefore finding wider application in the design of dense semiconductor packages.

Increased I/O combined with increased high requirements for high performance IC's has led to the development of Flip Chip packages. Flip chip technology fabricates bumps (typically Pb/Sn solder) on Al pads and interconnects the bumps directly to the package media, which are usually ceramic or plastic based. The flip-chip is bonded face down to the package through the shortest paths. These technologies can be applied not only to single-chip packaging, but also to higher or integrated levels of packaging in which the packages are larger, and to more sophisticated package media that accommodate several chips to form larger functional units.

The flip-chip technique, using an area array, has the advantage of achieving the highest density of interconnection to the device and a very low inductance interconnection to the package. However, pre-testability, post-bonding visual inspection, and Temperature Coefficient of Expansion (TCE) matching to avoid solder bump fatigue are still challenges. In mounting several packages together, such as surface mounting a ceramic package to a plastic board, the TCE mismatch can cause a large thermal stress on the solder lead joints that can lead to joint breakage caused by solder fatigue from temperature cycling operations.

For devices that have high power dissipation, cavity down BGA packages are frequently used. The BGA cavity down package has a structure such that the semiconductor die and the BGA balls both reside on the bottom side of the BGA substrate, that is the side of the BGA substrate that faces the printed wiring board. The structure thereby allows the top-side of the BGA substrate to be available for heat removal purposes.

As an illustration of a Prior Art cavity down package, a method of packaging a BGA is shown in FIG. 1. The features of this package can be identified as follows:

10' is the heatsink of the package, heatsink 10' has a surface that is electrically conductive; mounted in the heatsink is 12', the semiconductor device; contact points for the die 10' are closely spaced around the periphery of the die; the chip 12' is interconnected to surrounding circuitry be means of the interface 14' which contains one or more layers of interconnect wiring; layer 14' can contain a stiffener that provides rigidity to the substrate; contact points that have been provided in the surface of chip 12' are connected to substrate 14' by means of 16', the wire bond connections; the wire bond connections provide a wire bonded connection between a contact points on the IC die 12' and the copper traces 19' contained in layer

18', additional points of electrical contact are provided in the surface of substrate 14' by means of points 18' which are contact pads to which, typically, contact balls are connected for further mounting of the indicated package; device 12' is mounted inside a cavity that has been provided in the surface of the heatsink 14' and contacts the heatsink via layer 20', which is a thermally conductive adhesive layer, typically containing epoxy; the device 12' is further protected from the environment by being encapsulated in layer

22', which forms an epoxy based protective enclosure for device 12'; the layer

24' is the adhesive interface between the substrate 14 and the heatsink 10'.

The Prior Art package that is shown in FIG. 1 contains a heat sink in which a cavity is provided for the insertion of a semiconductor die, a substrate that contains one or more layers of interconnect lines and methods of encapsulating the mounted semiconductor die. Other, simpler methods can be used for mounting a semiconductor whereby the die is mounted directly on the surface of a Printed Circuit Board (PCB) while layers of metal interconnect within the PCB are used to provide the I/O connections of the mounted die to surrounding circuitry. In most applications of this kind, the die is still provided with contact balls, these contact balls rest directly on the surface of the PCB and are connected to electrical points of contact that are opened in the surface of the PCB.

U.S. Pat. No. 5,583,378 (Marrs et al.) (cited by the inventor) shows a metal panel 204 used as a thermal conductor. The chip 202 is attached to the thermal conductor 204 by metal epoxies 206. See FIG. 2A, also see FIGS. 4A through 4L.

U.S. Pat. No. 5,777,386 (Higashi et al.) (cited by the inventor) shows a flip chip package having a heat conductor but ceramic substrate. See col. 3, line 65. The package has heat conducting pattern 12 that conducts heat to the substrate (e.g. PCB) by solder balls.

U.S. Pat. No. 5,874,321 (Templeton, Jr. et al.) teaches a cavity up package with a conductive lid.

U.S. Pat. No. 6,020,637 (Karnezos) shows a heat spreader for a package.

U.S. Pat. No. 5,578,869 (Hoffman et al.) shows a metal base/panel for a package.

U.S. Pat. No. 5,289,337 (aghazadeh et al.) shows a related package.

SUMMARY OF THE INVENTION

A principle objective of the invention is to provide a method for the fabrication of high-density substrates that is used for the packaging of cavity-down flip chip semiconductor devices.

The process of the invention starts with a metal panel, overlying the metal panel is created an interconnect substrate making use of BUM and thin film processing technology while the process of the invention enables the use of stacked vias for the A connection of the flip chip bumps. The process of the invention creates, for instance, two patterned layers on the surface of the metal panel whereby the metal panel is used as the ground terminal of the power supply. The first layer that is created on the surface of the metal panel can be the power supply layer (this layer can also be used for some fan-out interconnect lines), selected points within the first layer are in direct contact with the metal panel for purposes of improved heat exchange to the metal panel and of improved ground power supply. The second layer that is created on the surface of the metal panel is primarily used for (fan-out) interconnect lines. The flip chip bumps are, under the process of the invention, connected to the second layer of the interconnect substrate. The process of the invention does not require any additional structures such as a dam for the containment of insulating encapsulation material (underfill) that at times is provided around a perimeter of a well into which a flip chip is inserted, making the process of the invention most cost effective.

BRIEF DESCRIPTION OF THE DRAWINGS

FIGS. 3a though 3f shows the Prior Art BUM processing sequence.

FIGS. 4a through 4f shows a Prior Art thin film processing sequence.

FIG. 5 shows a cross section of the mounting of a cavity down flip chip on the surface of a metal panel whereby two conductive layers have been created overlying the metal panel.

DESCRIPTION OF THE PREFERRED EMBODIMENTS

The above referenced related application that is assigned to a common assignee uses, for the creation of high-density BGA packages, a metal substrate on the surface of which is created a multi-layer interconnect substrate that is plastic based. The process of this related application starts with a metal panel, typically copper, but it can be other metals like aluminum or stainless steel, with a size of 18×24 inches, other sizes can obviously be used. The process of this related application takes advantage of what is known in the printed wiring board industry as the Build Up Multilayer (BUM) processing in combination with the use of thin film deposition equipment and processes that are used in the flat panel display industry to build high density packaging substrate devices.

To create this package, a first surface of the metal substrate is cleaned and used for the creation of the multi-layer interconnect substrate. This process of creation of the multi-layer interconnect substrate starts with the deposition of a layer of dielectric over the first surface (of the metal substrate) a set of vias is created through the layer of dielectric, over the layer of dielectric a layer of interconnect metal is deposited. The layer of interconnect metal is patterned to form the interconnect lines, this process can then be repeated with more depositions of layers of dielectric over which patterns of interconnect lines are formed. The last pattern of interconnect lines is covered with a solder mask and subsequently patterned to open an array of metal pads in the layer of dielectric, these metal pads are used for the connection of the BGA ball contact attachment.

The second surface of the metal substrate is next patterned to create openings in this second surface, these openings expose the first layer of dielectric that has been deposited on the first surface of the metal substrate. Openings are created in the exposed portions of the first layer of dielectric (typically using laser technology). These openings serve as pads for flip chip bump to connect the flip chips, which are mounted in the openings of the second surface of the metal substrate, to the interconnect substrate (that has been created as highlighted above on the first surface of a metal substrate).

Figure 1:
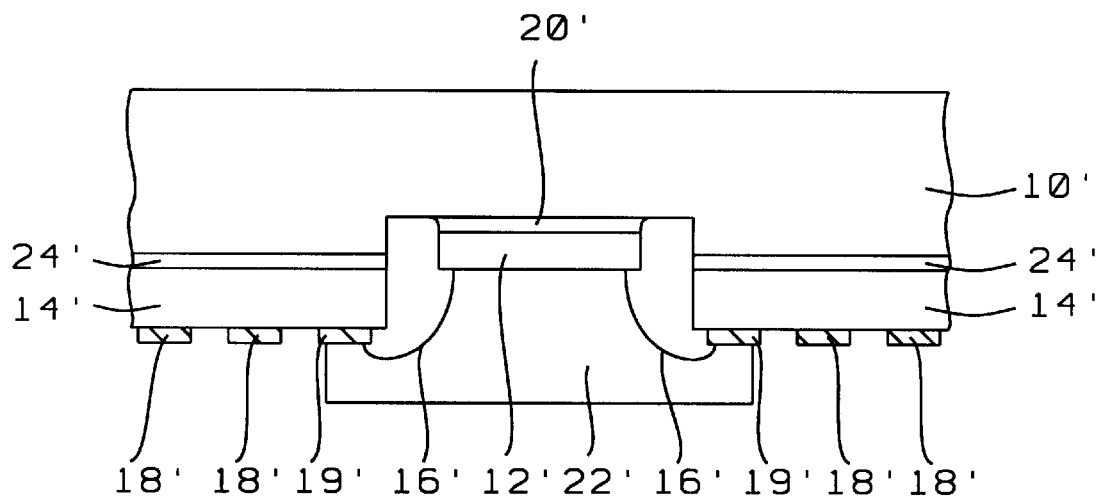
FIG. 1 shows a Prior Art cavity down package for mounting a wire-bonded chip.
Figure 2:
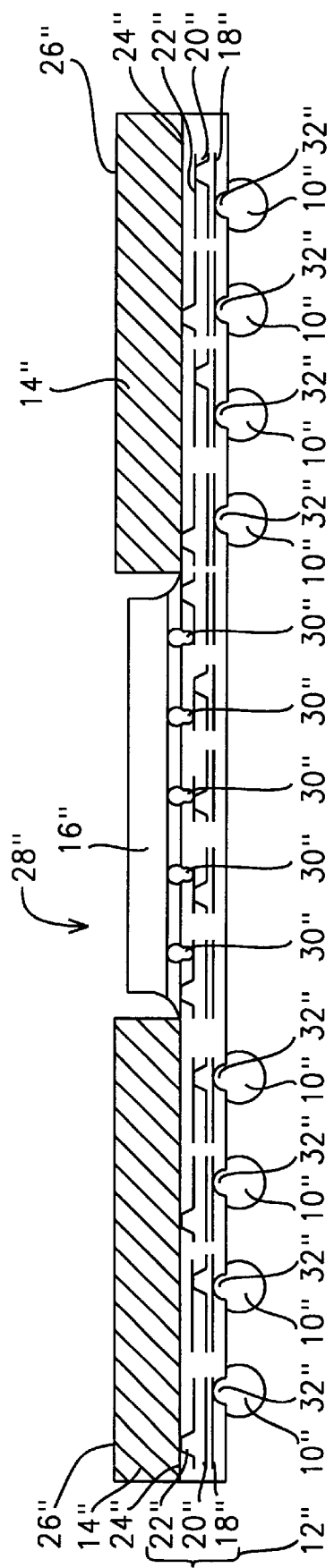
FIG. 2 shows a cross section of the above referenced related application of a single chip flip chip with three interconnect layers.

To further illustrate the processing steps that are part of the above referenced related application that is assigned to a common assignee, FIG. 2 of this related application will be referred to as part of the present application. FIG. 2 shows a cross section of a single chip flip-chip package with three interconnect layers.

The interconnect substrate 12" contains the totality of the sequence of layers that are created within the scope of the invention for making a high density packaging substrate.

The interconnect substrate 12" has two surfaces. The surface of the interconnect that is in contact with the metal substrate 14" is the-second surface of the interconnect substrate the surface of the interconnect substrate into which the contact balls 10" are mounted is the first surface of the interconnect substrate.

The metal layer within the interconnect substrate 12" that is closest to the first surface 24" of the metal substrate 14" is referred to as the bottom layer, the metal layer within the interconnect substrate 12" that is furthest removed from the first surface 24" of the metal substrate 14" is referred to as the top layer.

The metal substrate 14" has two surfaces, the first surface 24" of the metal substrate is the surface on which the interconnect substrate 12" is created. The second surface 26" of the metal substrate is the surface into which openings are etched for the insertion of BGA chips.

The three interconnect layers within the interconnect substrate 12" are highlighted as layer 18" (which can be a ground layer), layer 20" (which can be a power layer) and layer 22" (which can be a signal layer). Metal substrate 14", typically copper, is about 30 mils thick. The metal used for substrate 14" is not limited to copper but can be another metal such as aluminum or stainless steel. The size of the metal substrate 14" is typically 18×24 inches but the size of the metal substrate 14" is not limited to these dimensions. The invention uses the Build Up Multilayer (BUM) technology (a printed circuit board technology) in combination with thin film deposition technology (a technology used for the creation of flat panels).

It must be noted from FIG. 2 that the metal substrate 14" and the contact balls 10" are mounted on opposite sites of the interconnect substrate 12" while the metal substrate 14" and the contact balls 10" are also aligned with each other (the metal substrate 14" is located above the contact balls 10"). The IC 16" is mounted in an opening 28" created in the metal substrate 14". The opening 28" into which the flip chip 16" is mounted is a cavity that is created by masking and etching of the second side 26" of the metal substrate 14".

A dielectric layer (not shown) is first deposited over the metal substrate 14" on the first side 24" of the metal substrate 14" as a first step in the creation of the interconnect substrate 12". This deposition of the dielectric can be done by either lamination or by a coating and curing process. The layer of dielectric typically has a thickness of between about 10 and 40 μm. It a required that the dielectric has a CTE that is higher than the CTE of the metal substrate. This is to assure that, after the metal substrate with the deposited layer of dielectric are cooled down to room temperature, the dielectric film is under tension. The dielectric layer can be epoxy with or without a thin glass reinforcement, a polyimide film or any other build-up dielectric material.

The first step in the creation of the interconnect substrate 12" is the creation of a thin film interconnect metal layer 22" on top of the layer of dielectric. The thin film deposition technique contains the following steps of depositing an interconnect plating base by consecutive sputtering of Cr, Au and Cr, masking and patterning for semi-additive plating of the interconnect pattern, wet etching the thin Cr layer to expose the Au, depositing semi-additive plating of the interconnect pattern by depositing Au, Ni and Cu, removing of the mask for the semi-additive plating of the interconnect pattern, wet etching to remove the sputtered plating base from between the interconnect pattern and coating the created interconnect pattern with a layer of dielectric. For applications where solder connections need to be made to the interconnect pattern, the above dielectric forms a solder mask and vias are created in the dielectric for the solder connections.

The state of the art BUM technology provides the technology to add layers 20" and 18" on top of the created thin film interconnect layer 22", these added layers 20" and 18" typically can be for power and ground interconnects but can also be used for fan-out interconnections. The last layer created in this manner, that is the layer 18" in FIG. 2 or the layer furthest removed from the first side 24" of the metal substrate 14", must provide the interconnects with the contact balls of the BGA structure and must therefore be coated as a solder mask.

The second side 26" of the metal substrate must next be prepared for the mounting of the flip chip;,an opening or cavity 28" must therefore be created in the metal substrate 14" that can accommodate the flip chip. The second side 26" of the metal substrate 14" is therefore masked and etched to create the opening 28" in the metal substrate 14". The size of this opening can vary and depends on the number of flip chips that are to be mounted on the interconnect substrate 12". The wet etch of the second side 26" of the metal substrate exposes the dielectric layer that has previously been deposited (on the first side 24" of the metal substrate 14", see above). Openings 30" must be created in this layer of dielectric through which the flip chip 16" can be connected to the contact points in the first layer 22". A laser is used to create these openings.

The openings 32" for the BGA solder ball connections are created to expose the top metal pads (the pads in the interconnect layer 12" that are furthest away from the metal substrate 14"). The flip chip 16" is inserted into the interconnect layer 12" within the cavity 28", the interconnect layer 12" is brought into contact with the contact balls 10", electrical contact has then been established between the bump pads 30" of the flip chip 16" and the contact balls 10".

In summary, in the above referenced related application the minimum metal lines and spaces used are in the range of 12–40 µm and the dielectric insulation is 10–25 µm. Printed wiring board BUM is used in this related application to build the power supply layer as well as the interconnect line metal layer. High density interconnect layers are fabricated with the thin film interconnect layers. Typical-steps of BUM processing are used for metal depositions while thin film sputter equipment (typically used for a flat panel creation process) is used to sputter metal in depositing a plating base for the semi-additive plating to make the thin film lines.

While the above FIG. 2 shows a cross section of a single chip flip chip with three interconnect layers, other applications of the same above referenced related application can be used to create for instance a single chip package with two interconnect layers, multi-chip structures that contains three interconnect layers in the interconnect substrate or multi chip packages with four interconnect layers contained within the interconnect substrate. The number of chips that are mounted using this method and the number of interconnect layers that are created in the substrate of the package are not limited by the method of the above referenced related application.

The processing sequence that is used to create interconnect lines in the BUM technology is highlighted in FIGS. 3a through 3f, as follows:

1) FIG. 3a, the starting substrate 80 can be a cleaned metal panel (substrate) without any interconnect layers;
2) FIG. 3b, coating of the substrate 80 with a layer 82 of dielectric;
3) FIG. 3c, creating of vias 84 in the dielectric 82 for electrical connections to the substrate 80;
4) FIG. 3d, etching and swelling of the dielectric 82 to roughen the surface and thereby promote adhesion for the subsequent electroless copper deposition;
5) FIG. 3d, electroless seeding of the dielectric;
6) FIG. 3e, plating of the panel with a layer 88 of copper; and
7) FIG. 3f, masking and etching the deposited layer 88 of copper to create the metal pattern 90 in the BUM layer.

Thin film deposition technique contains the following steps, see FIGS. 4a through 4f:

1) FIG. 4a, depositing an interconnect plating base 50 by consecutive sputtering of Cr and Cu over a layer of dielectric 51 that has been deposited on the surface 49 of a substrate surface; conventional processing uses sputter and evaporator equipment to deposit the thin layer 50 of metal that serves as the plating base; a via 59 has been created in the layer 51 of dielectric; alternatively, the plating base can be made by etching and swelling the dielectric layer, followed by an electroless step to deposit a thin layer of copper on which may or may not be (electrolytically) plated another layer of copper, resulting in a plating base of about 1 to 2 µm thickness;
2) FIG. 4b, a layer 52 of photoresist is deposited over the surface of the interconnect plating base 50; this layer 52 of photoresist is masked and patterned creating the pattern 53 of the interconnect lines;
3) FIG. 4c, semi-additive plating 54 of the interconnect pattern is performed by depositing Cu in the openings that have been created in the layer 52 of photoresist; this plating 54 plates the surface of the (copper) lines that are to be created for the interconnect pattern;
4) FIG. 4d, removing of the mask 52 (FIG. 4b) of photoresist that has been used as a mask for the semi-additive plating of the interconnect pattern; areas 56 are the regions in the plating base layer 50 that must be removed to create the interconnect pattern;
5) FIG. 4e, wet etching to remove the plating base metal layer 56, FIG. 4d, from between the interconnect pattern 54;
6) FIG. 4f, coating the created interconnect pattern with a layer 58 of dielectric; vias 63 and 65 have been created in the layer 58 of dielectric for points of electrical contact by either using the photolithographic approach of exposing and developing or by using a laser
7) for applications where wire bond connections need to be made to the interconnect pattern the top dielectric forms a solder mask and vias are created in the dielectric for the solder connections.

In the present invention, the minimum metal lines and spaces used are in the range of 12–40 µm and the dielectric insulation is 10–25 µm. Printed wiring board BUM technology is used in the present invention to build the power supply layer as well as the (relatively low density) interconnect line metal layer. High density interconnect layers are fabricated using thin film interconnect technology. The dielectric thickness that is obtained using thin film technology is much thinner than the dielectric thickness that is obtained using BUM technology, which is in the range of 50–75 µm. In using the BUM technology therefore a modified coating approach as practiced by the build up industry needs to be used. For example, in the case of the curtain coating or screen-printing, the process parameters are adjusted to achieve a thin dielectric coating of 12–25 µm required for this design. Alternatively, a spinning or a spinning-extrusion combination practiced in the display industry is used to accomplish the same purpose. To create high-density, thin film interconnect lines, the conventional exposure station of a hard contact on a corresponding photoresist layer is not capable to provide the resolution and the required yield. For the processes of the invention, a high resolution photo resist, with either projection printing or proximity printing, combined with laser beam scanning technology must be used to obtain a high yield.

FIG. 5 shows a cross section of a High Density BGA package where two patterned metal layers 40 and 41 are created on top of the metal substrate 14, the metal panel 14 can be used as the ground terminal for the power supply. The two layers 40 and 41 combined form the interconnect substrate 42. The first layer 40, that is the layer closest to the metal panel 14, essentially serves as the power supply layer. This layer 40 however can also be used for some fan out interconnections. The second layer 41 is the layer to which the flip chip bumps 30 are connected, this layer 41 is primarily used for the fan out interconnect wiring. Contact balls 10 are provided to further interconnect the package of the invention that is shown in cross section in FIG. 5 to surrounding circuitry and components.

It must be noted in FIG. 5 that a number of the wiring connects that from part of layer 40, such as 31, 32, 33, and 34, make direct contact with the metal panel 14. This is part of the method of the invention and provides significantly improved heat exchange between the interconnect substrate 42 and the metal panel 14.

Figure 6:
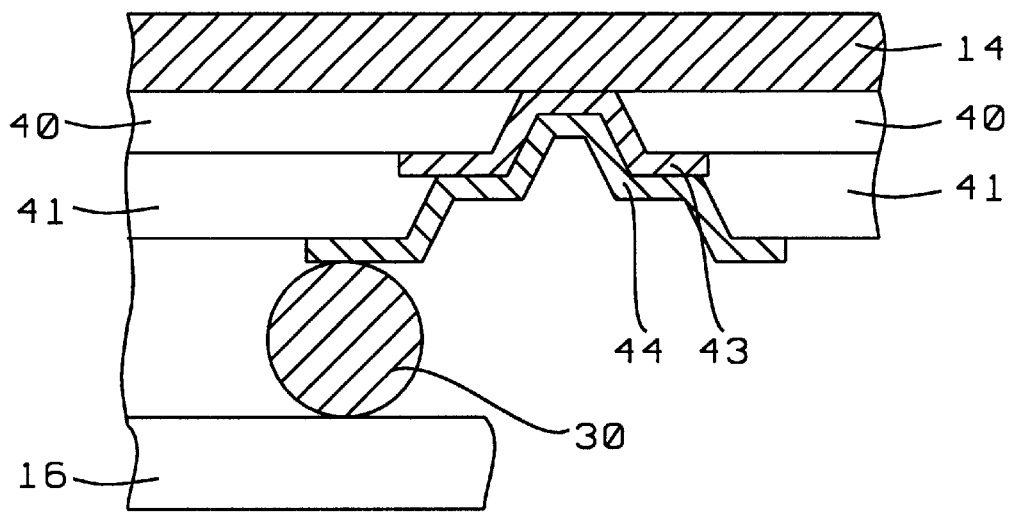
FIG. 6 shows a cross section of the mounting of a cavity down flip chip on the surface of a metal panel whereby two conductive layers have been created overlying the metal panel, a stacked thermal via is used for this method.

FIG. 6 shows how, to conduct heat from chip 16 to the metal panel 14, a stacked via structure 43/44 is used where via 43 is metal 1 and via 44 is metal 2. The stacked via 43/44 is made from a small via 43 in layer 40 that is immediately adjacent to the metal panel 14 and a larger via 44 that is made in the overlying layer 41. A flip chip 16, containing a matrix of metal flip chip bumps 30, is joined to the metal pad 44 of metal 2. The flip chip bumps 30 are made of solder or gold. The heat is therefore transferred from the flip chip 16 to the flip chip bump 30, through the stacked via 43/44 to the metal panel 14.

Figure 7:
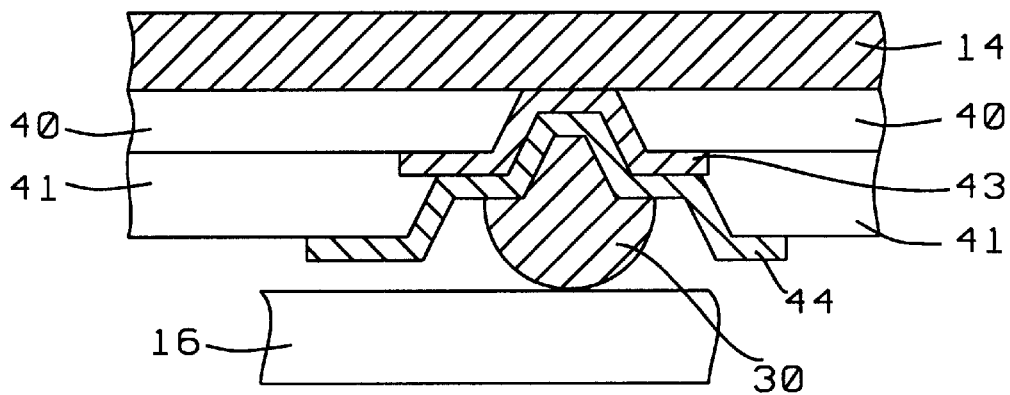
FIG. 7 shows a cross section of another arrangement of a stacked metal via.

FIG. 7 shows how, in a variation of the stacked via of FIG. 6, the flip chip bump 30 can be placed centered to and on top of the stacked via 43/44. The stacked via 43/44 provides a direct path of thermal heat transfer between the flip chip 16 and the metal panel 14, forming an efficient method and path of heat exchange.

Figure 8:
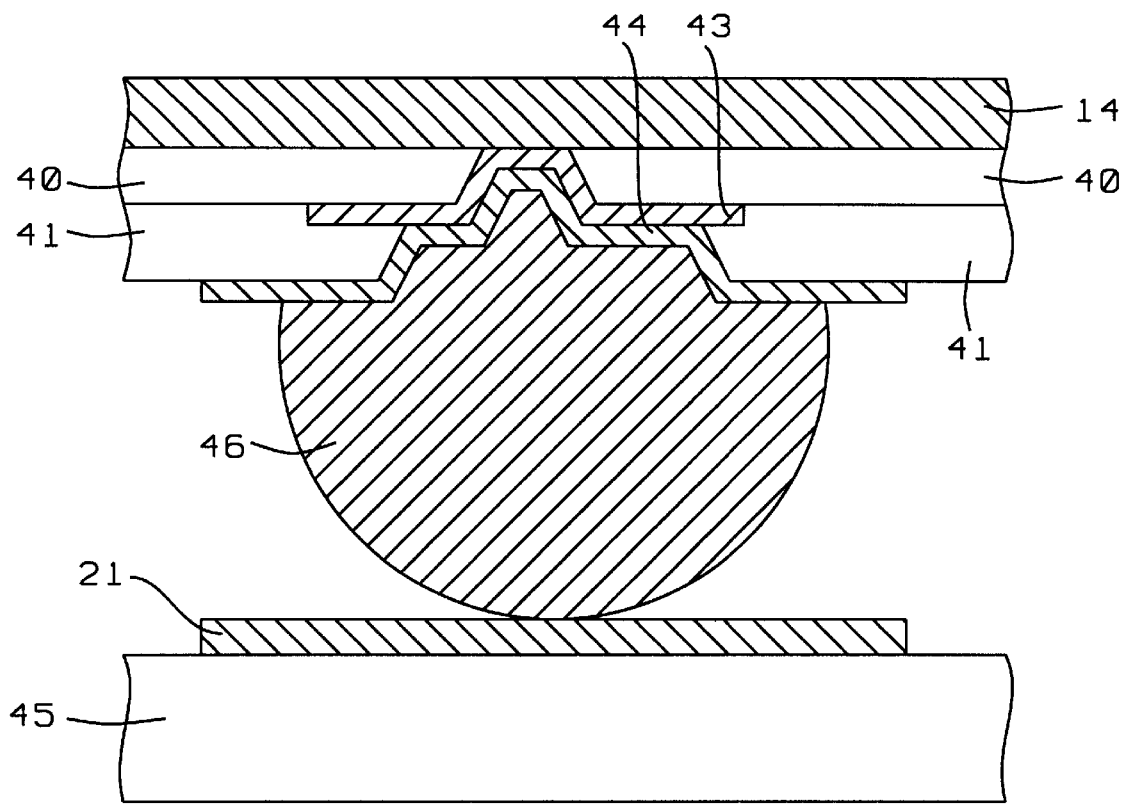
FIG. 8 shows a cross section of the application of a solder ball in combination with a stacked thermal via.

FIG. 8 shows how, in a manner that is similar to the previously highlighted heat conduction paths of FIG. 6 and FIG. 7, a heat conductivity path exists between the Printed Circuit Board 45, on the surface of which a metal contact point 21 is provided, to metal panel 14 through the solder ball 46 that is in direct contact with the stacked vias 43/44. The diameter of solder ball 46 is larger than the diameter of a flip chip bump 30 (FIGS. 5, 6, and 7). For example, the diameter of solder ball 46 is 29 mil for a solder ball pitch of 1.27 mm, this can be compared with a flip chip bump of 5 mil for flip chips with a 0.25 mm bump pitch.

Figure 9:
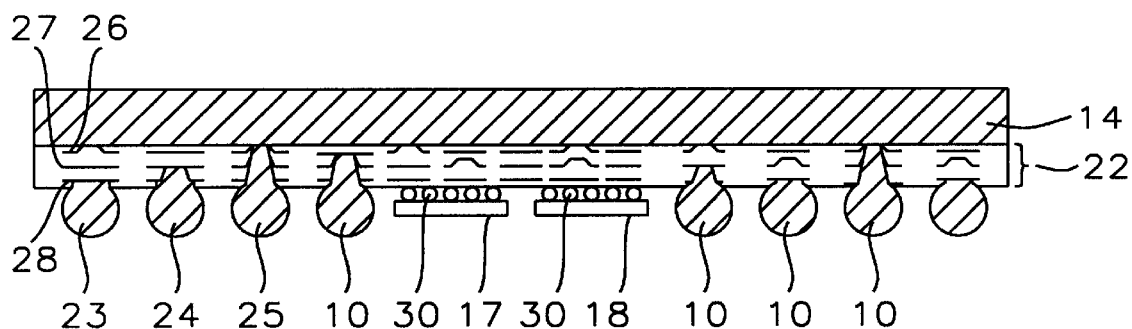
FIG. 9 shows a cross section of a multi-chip cavity down flip chip package of the invention.

The basic design that has been highlighted up to this point can be used to package more than one flip chip. This is shown in FIG. 9 where two flip chips 17 and 18 are mounted on interface substrate 22, which is attached to the metal substrate 14. The number of flip chips that can be mounted in this manner is not limited to two flip chips under the method of the invention. FIG. 9 shows a total of three patterned metal layers, that is layers 26, 27, and 28 where the three layers combined form the interconnect substrate 22. In the cross section that is shown in FIG. 9 the metal panel 14 can still be used as the ground power supply. Layer 26 which is closest to the metal panel 14 and serves as the power layer, the top two layers 27 and 28 are used for interconnect. In general, the power supply layer 26 is fabricated using BUM technology while the high density interconnect layers 27 and 28 are created using thin film deposition methods.

The cross section of the design of the invention that is shown in FIG. 9 shows that the invention provides for the creation of multiple, overlying vias that form the electrical interface between the contact balls 10 and the interconnect substrate 22 and the ground plane that is provided by the metal panel 14. FIG. 9 shows an example of a contact ball 23 that penetrates the interconnect substrate to the surface of layer 28, a contact ball 24 that penetrates the interconnect substrate through layer 28 to the surface of layer 27 and a contact ball 25 that penetrates layers 28 and 27 of the interconnect substrate 22 to layer 26 where this'contact ball is grounded to the metal panel 14. Additional variations of this interconnect scheme can readily be identified from FIG. 9, providing further evidence of the flexibility of the process of the invention.

Additional detail will be provided below relating to the creation of interconnect vias. Interconnect vias can be either stacked vias of merged vias, the processes that are applied for the creation of these two types of vias are described following.

First will be listed in sequence of execution the processing steps that are required to create stacked vias, after this the processing steps of creating stacked vias will be explained in further detail using FIGS. 10a through 10i.

The processing steps required to create stacked vias are:
provide a metal panel
coat the surface of the metal panel with a first layer of dielectric
deposit a first layer of copper foil on the surface of the first layer of dielectric, using methods of laminating or plating
create first via openings in the first copper foil using methods of masking and etching
drill first holes through the first layer of dielectric that align with the first via openings that have been created in the first copper foil using laser drilling
plate a first layer of metal over the surface of the first copper coil and the inside surfaces of the first openings that have been created through the first layer of dielectric
mask and etch the first layer of metal overlying the first layer of dielectric, creating first interconnect lines and first via pads on the surface of the first layer of dielectric
deposit a second layer of dielectric over the surface of the first layer of dielectric, including the surface of the first interconnect lines and the first via pads that have been created on the surface of the first layer of dielectric
laminate or plate a second layer of copper foil over the surface of the second layer of dielectric
create second via openings in the second layer of copper foil, these second via openings to align with the first via openings created in the first layer of copper foil
drill second holes through the second layer of dielectric that align with the first via openings that have been created in the first copper foil using laser drilling, removing the second layer of dielectric from the first vias that have been created in the first layer of dielectric
plate a second layer of metal over the surface of the second copper foil and the inside surfaces of the second openings that have been created through the second layer of dielectric, including the inside surfaces of the first vias, and
mask and etch the second layer of layer of metal overlying the second layer of dielectric, creating second interconnect lines and second via pads on the surface of the second layer of dielectric that overlay and interconnect with the first vias and first interconnect lines that have been created in the first layer of dielectric.

The above sequence of processing steps for the creation of stacked vias will now be described using FIGS. 10a through 10i.

Figure 10A:
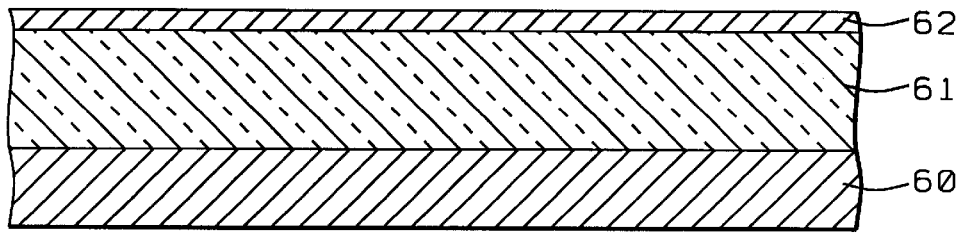
FIGS. 10a through 10i show the processing flow for the creation of stacked vias.

The process starts, FIG. 10a, with a metal panel 60 over the surface of which is coated a layer 61 of dielectric. A copper foil 62 is created on the surface of the layer 61 of dielectric by process of laminating or panel plating.

Figure 10B:
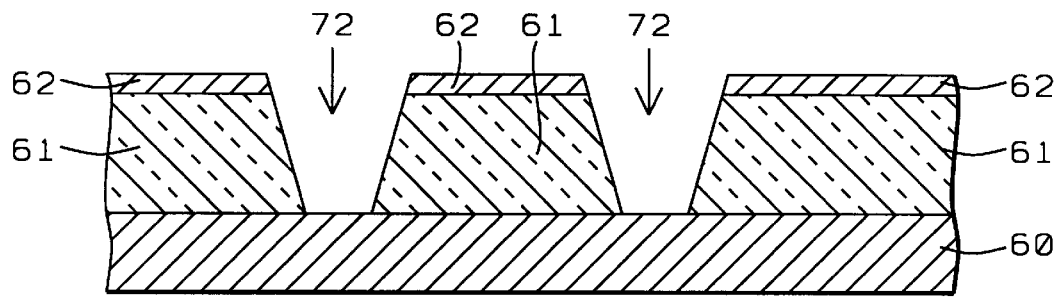

Openings 72, FIG. 10b, are created in the copper foil 62 using conventional methods of masking and etching the layer 62 of copper foil. These openings 72 are further propagated into the underlying layer 61 of dielectric, the openings 72 penetrate the layer 61 of dielectric and therefore partially expose the surface of the metal panel 60. The propagation of the openings 72 through the layer 61 of dielectric uses laser technology to drill the openings.

Figure 10C:
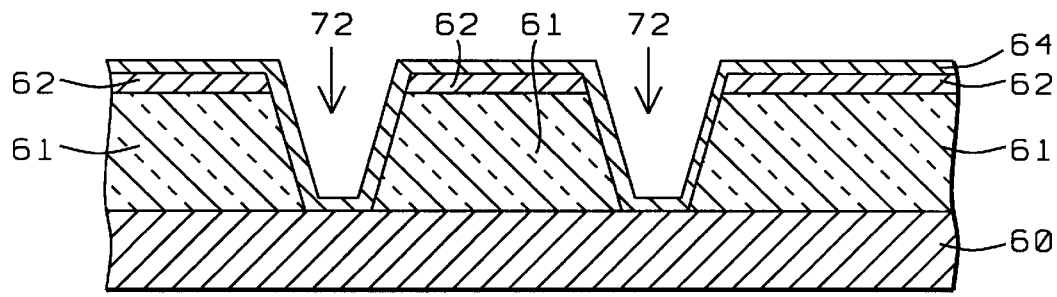

FIG. 10c shows a cross section of the metal panel after a metal layer 64 has been deposited inside the vias 72 and over the surface of the metal foil 62. Masking and etching the metal layer 64, using conventional methods of photolithographic exposure and development, creates (FIG. 10d) a via pad 73 and a line structure 74 overlying the layer 61 of dielectric and overlying the inside surfaces of openings 72.

Figure 10D:
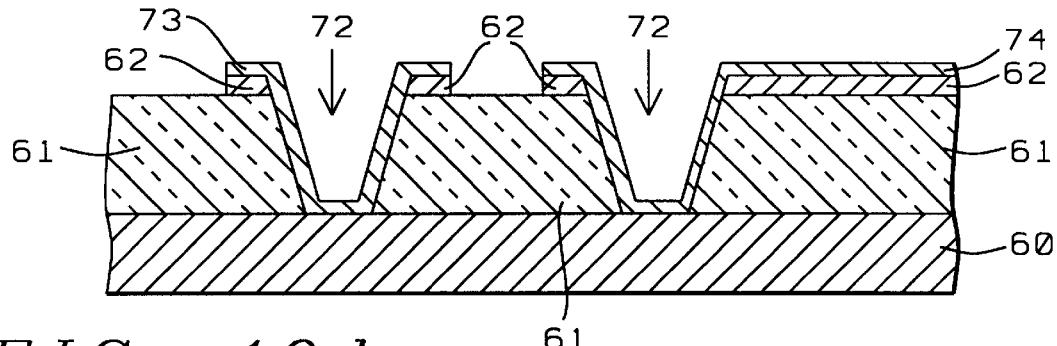
Figure 10E:
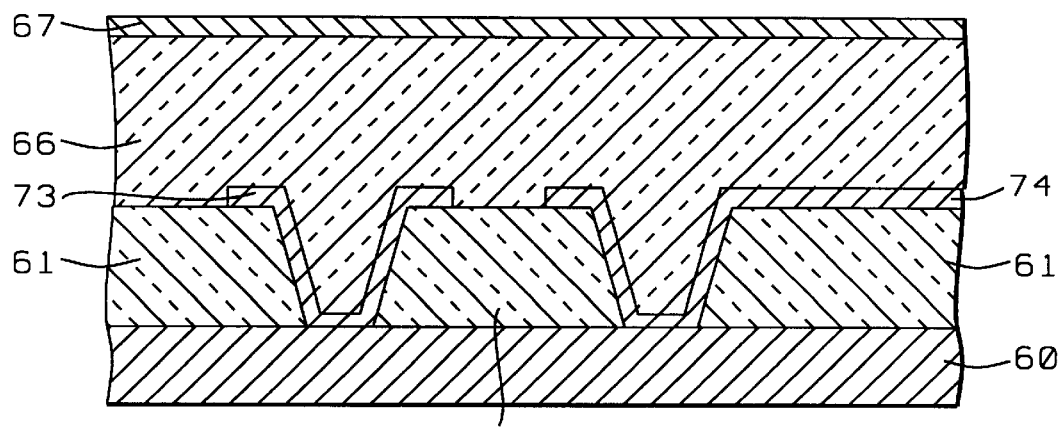

The process is now repeated, a second layer 66, FIG. 10e, of dielectric is deposited over the structure of FIG. 10d followed by creating a second copper foil 67 (by laminating or plating) on the surface of the second layer 66 of dielectric. For simplicity of presentation, patterned layers 62 of copper foil that have been shown in cross section in FIG. 10d are no longer shown in FIGS. 10e through 10i since these layers can, from a functional point of view, be considered as being part of and integrated with the overlying layers 73/74.

Figure 10F:
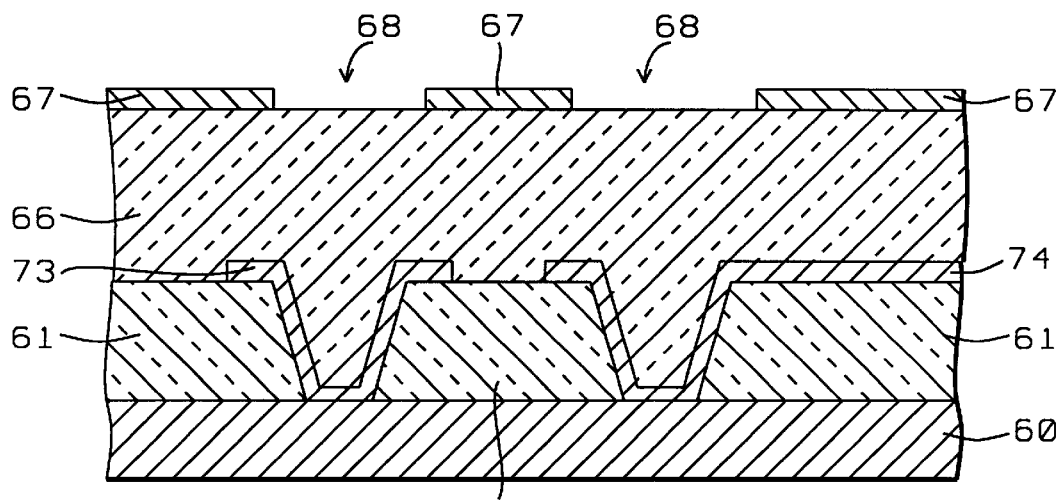

The layer 67 of copper foil is masked and etched, creating openings 68, FIG. 10f, in the layer of copper foil. These openings 68 align with the underlying metal via pad 73 and the via that is connected to the underlying interconnect line 74. Using laser technology, holes 68, FIG. 10g, are created through the second layer 66 of dielectric, partially exposing the surface of the via pad 73 and the via that is connected to the interconnect line 74.

Figure 10G:
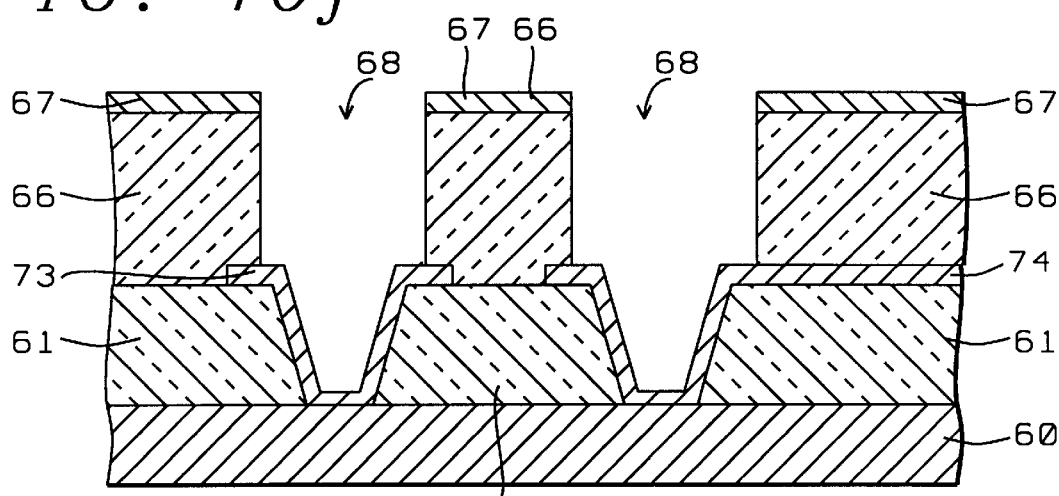
Figure 10H:
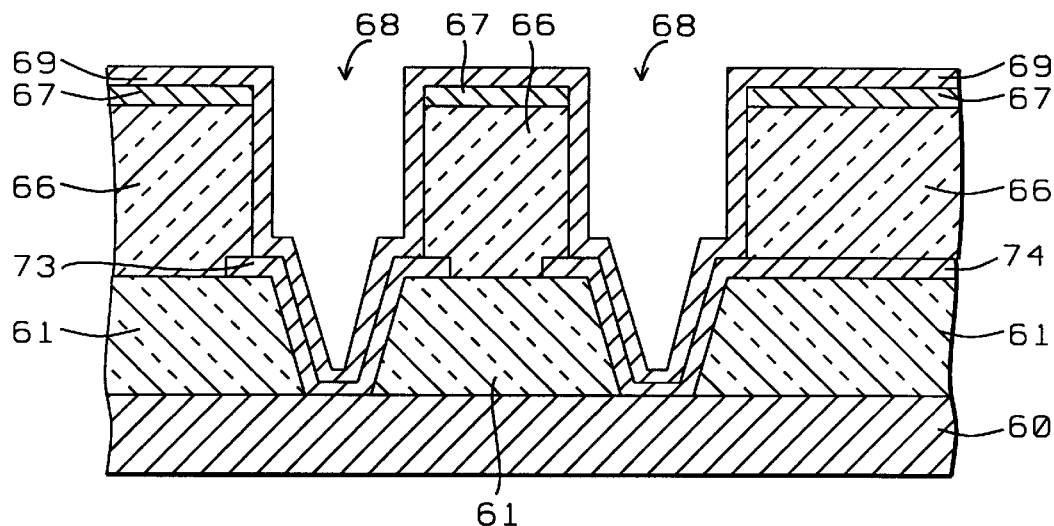

A layer 69 of metal, FIG. 10h, is electroplated over the structure that is shown in cross section in FIG. 10g, that is over the surface of the patterned layer 67 of metal foil and over the inside surfaces of the openings 68 that have been created in the second layer 66 of dielectric, including the inside surfaces of the via pad 73 and the via that is connected to interconnect line 74 that have been created in the (first) layer 61 of dielectric.

Figure 10I:
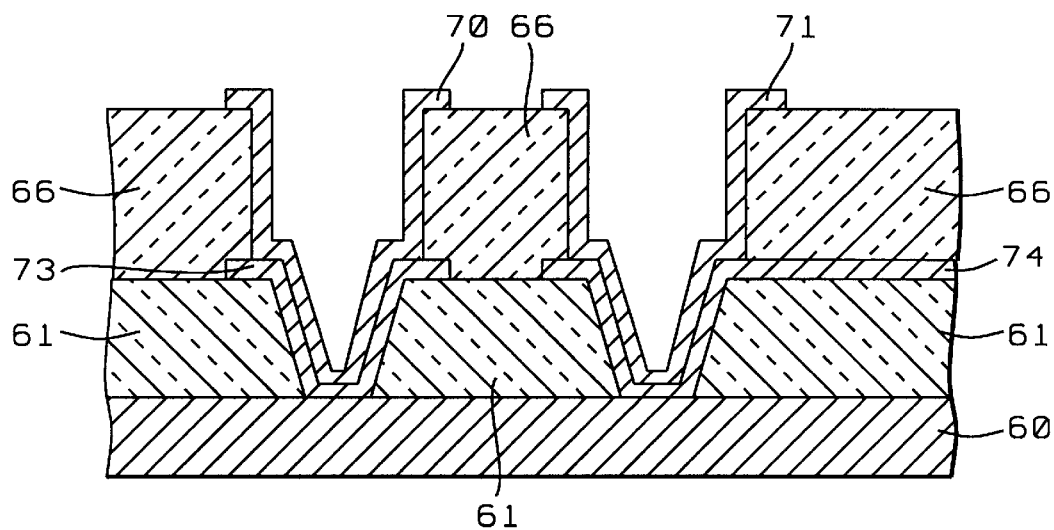

A final masking and etching of the deposited layer 69 results in the cross section that is shown in FIG. 10i, showing a stacked via 70 that makes contact with the metal panel 60 by means of the via 73, further showing a stacked via 71 which contacts the interconnect line 74 and also contacts the metal panel 60. From the cross sections that are shown in FIG. 10i, it is clear why these vias are called stacked vias: the layers of metal that form the vias overlay each other or are, in other words, stacked one on top of the other.

For simplicity of presentation, patterned layers 67 of copper foil that have been shown in cross section in FIG. 10h are not shown in FIG. 10i since these layers can, from a functional point of view, be considered as being part of and integrated with the overlying layers 70/71.

The processing steps that are required to create merged vias are as follows:

provide a metal panel coat the surface of the metal panel with a first layer of dielectric deposit a first layer of copper foil on the surface of the first layer of dielectric, using methods of laminating or plating create first via openings in the first copper foil using methods of masking and etching, the interconnection lines and via pads are also created in the same step coat a second layer of dielectric of the surface of the first layer of dielectric and the first metal layer deposit a second layer of copper foil on the surface of the second layer of dielectric, using methods of laminating or plating create second via openings in the second copper foil-using methods of masking and etching, these second via openings align with the first via openings created in the first copper foil use a laser drill to drill holes through the second or through the second and the first layer of dielectric, these holes are aligned with the first and the second via holes, exposing the first vias, further partially exposing the surface of the metal panel where holes are drilled that penetrate both layers of dielectric plate metal over the inside surfaces of the holes created in the second or in the second and the first layer of dielectric, and patterning and etching the plated metal, creating interconnect lines and contact vias on the surface of the second layer of dielectric.

FIGS. 11a through 11f describe the processing steps that are performed for the creation of merged vias.

Figure 11A:
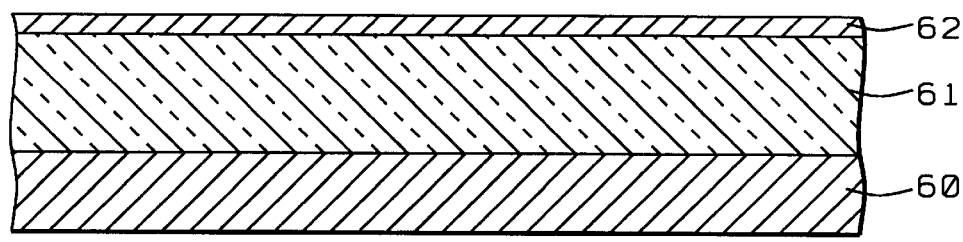
FIGS. 11a through 11f show the processing flow for the creation of merged vias.

The process starts, FIG. 11a, with a metal panel 60 over the surface of which is coated a first layer 61 of dielectric. A copper foil 62 is created on the surface of the layer 61 of dielectric by process of laminating or panel plating.

Figure 11B:
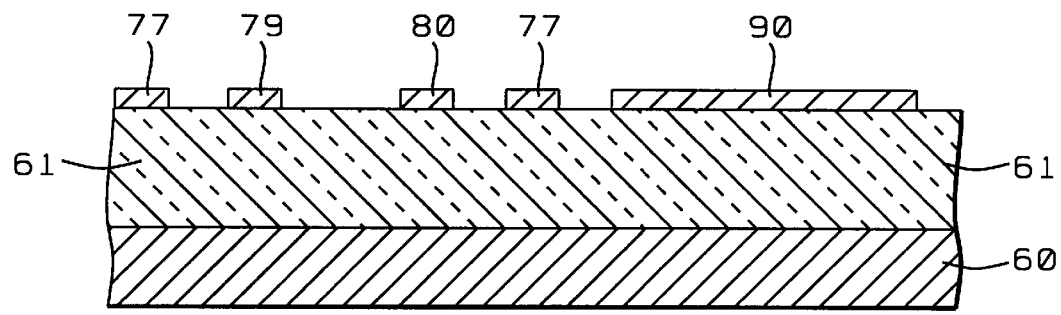

Openings, FIG. 11b, are next created in the layer 62. These openings are surrounded by via pads 79 and 80, 77 represents interconnect lines that are created in the same processing step. Via pad 90 is also created in layer 62.

Figure 11C:
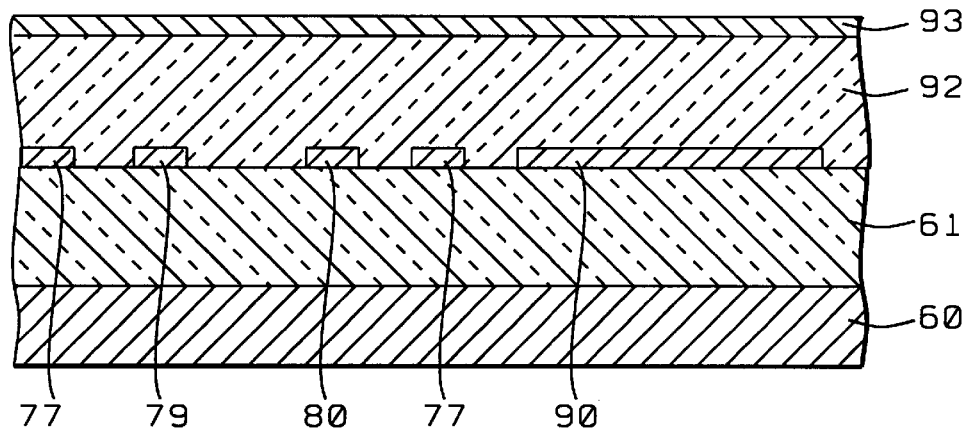

A second layer 92 of dielectric, FIG. 11c, is coated over the surface of the first layer of dielectric, including the surface of the metal pattern 77, 79, 80 and 90 that has been created on the surface of the fist layer 61 of dielectric. A layer 93 of copper foil is deposited over the surface of the second layer 92 of dielectric, FIG. 11c, by methods of lamination or plating.

Figure 11D:
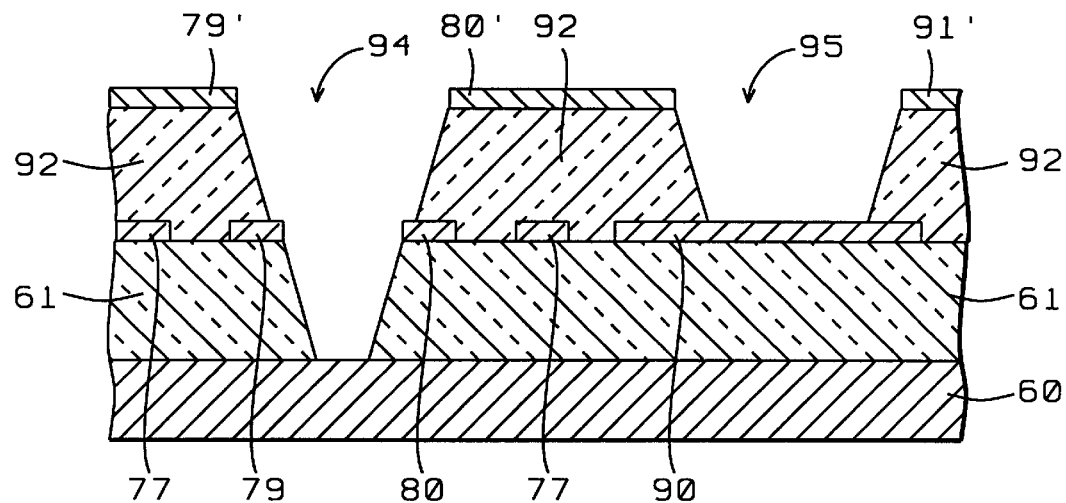

FIG. 11d shows how via holes 94 and 95 are created in the copper foil 93, it must be noted that hole 94 aligns with the space over the surface of layer 61 between via pads 79 and 80, FIG. 11b, while hole 95 aligns with pad 90, FIG. 11b. The layer 93 remains in place surrounding the perimeter of openings 94 and 95, layers 79', 80' and 91'. FIG. 11d further shows the extension of the holes 94 and 95 through the second layer 92 of dielectric, partially exposing the surface of the pattern 79, 80 and 90 that has been created in the first metal foil 62 of FIG. 11a. It must be noted in FIG. 11d that the opening 94 penetrates both the second layer 92 and the first layer 61 of dielectric, further that hole 95 penetrates only the second layer 92 of dielectric.

Figure 11E:
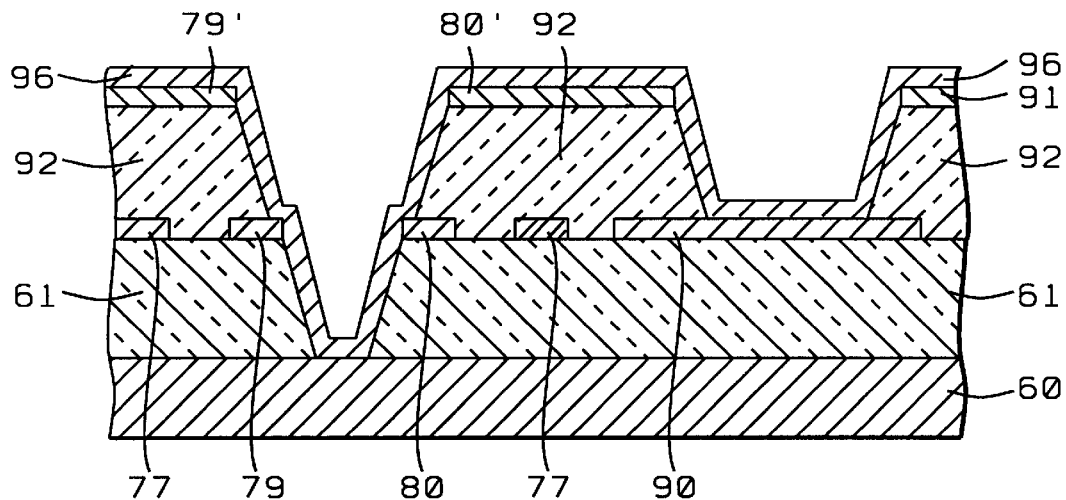

A layer 96 of metal is next plated over the surface of the structure that is shown in FIG. 11d, see FIG. 11e, including the inside surfaces of the openings 94 and 95. This layer 96 of metal is in contact with via pads 79, 80 and the via pad 90.

Figure 11F:
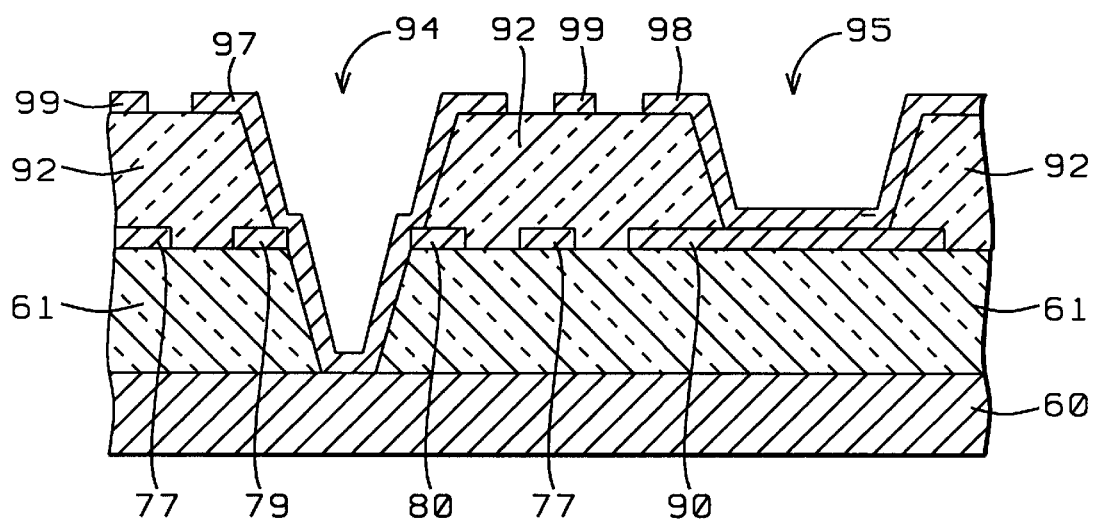

As a final step in the creation of merged vias, layer 96 of metal is etched, leaving in place the merged via 97, FIG. 11f, that extends through the two layers 61 and 92 of dielectric and the via 98 that connects via pad 90 (FIG. 11d) with metal on the surface of layer 92 of dielectric. Metal interconnect lines 99 are also created at the same time.

It is clear from the cross section that is shown in FIG. 11f why the vias that are created are called merged vias, that is no two layers are deposited over each other to create the walls of the via (as was the case for the previously highlighted stacked vias) while at the same time a via can be created that penetrates both layers of dielectric and a via that penetrates only the upper layer of dielectric.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating an interconnect substrate overlying a metal panel, said interconnect substrate having a first and a second surface, said interconnect substrate comprising a first and a second patterned layer of interconnect metal, whereby semiconductor devices and Ball Grid Array contact balls are attached to said first surface of said interconnect substrate, comprising the steps of:

providing a metal panel said metal panel having a first surface and a second surface, said second surface of said interconnect substrate making contact with said first surface of said metal panel;

providing at least one semiconductor device, said at least one semiconductor device being provided with metal bumps for semiconductor device interconnect;

cleaning said first surface of said metal panel;

creating a first patterned layer of interconnect metal comprising a first layer of interconnect lines and contact pads by depositing a first layer of dielectric over said first surface of said metal panel, then;

creating a first via pattern in said first layer of dielectric, providing openings to said first surface of said metal panel, then;

depositing a first layer of interconnect metal over said first layer of dielectric, contacting said first surface of said metal panel through the first via pattern in said first layer of dielectric, then;

patterning said first layer of interconnect metal, completing said creation of a first layer of interconnect metal;

creating a second patterned layer of interconnect metal comprising a second layer of interconnect lines and contact pads by depositing a second layer of dielectric over said first layer of dielectric, including said first patterned layer of interconnect metal, then;

creating a second via pattern in said second layer of dielectric, providing openings to said first patterned layer of interconnect metal, then;

depositing a second layer of interconnect metal over the surface of said second layer of dielectric, contacting said contact pads in said first layer of interconnect lines through the second via pattern in said second layer of dielectric, then;

patterning said second layer of interconnect metal, completing said creation of a second patterned layer of interconnect metal;

depositing a third layer of dielectric over the surface of said second layer of dielectric, including said second patterned layer of interconnect metal;

creating a third via pattern in said third layer of dielectric, providing openings to said contact pads in said second patterned layer of interconnect metal, whereby said third layer of dielectric serves as a solder mask, providing points of electrical access to said second patterned layer of interconnect metal for semiconductor device bumps and for Ball Grid Array contact balls;

subdividing said metal substrate into individual substrates;

connecting at least one of said semiconductor devices to said points of electrical access to said second patterned layer of interconnect metal by means of metal bumps provided on said semiconductor devices by solder reflow or by other means of bumps to metal contact pad attachment;

filling space between said at least one semiconductor device and said third layer of dielectric with dielectric material by an underfill step;

providing Ball Grid Array contact balls; and attaching said Ball Grid Array contact balls to said first surface of said interconnect substrate by solder reflow or by other means of bumps to metal contact pad attachment.

2. The method of claim 1 wherein at least one of said first patterned layer of interconnect metal and said second patterned layer of interconnect metal is created using thin film technology.

3. The method of claim 1 wherein at least one of said first patterned layer of interconnect metal and said second patterned layer of interconnect metal is created using Build Up Multilayer (BUM) technology.

4. The method of claim 1 wherein at least one of said first patterned layer of interconnect metal and said second patterned layer of interconnect metal is created using lamination technology followed by photo masking and wet steps.

5. The method of claim 1 wherein said points of electrical access to said second patterned layer of interconnect metal are plated using solder as a source.

6. The method of claim 1 wherein said points of electrical access to said second patterned layer of interconnect metal are plated using Ni/Au as a source.

7. The method of claim 1 wherein said semiconductor devices are flip chip devices.

8. The method of claim 1 whereby said method of creating a first and a second patterned layer of interconnect metal is extended to creating a multiplicity of patterned layers of interconnect metal, said multiplicity of patterned layers of interconnect metal to comprise a multiplicity of preceding and following patterned layers of interconnect metal, whereby a following patterned layer of interconnect metal is created over a preceding patterned layer of interconnect metal, comprising the steps of:

creating a patterned layer of interconnect metal comprising a layer of interconnect lines and contact pads by depositing a layer of dielectric over a preceding patterned layer of interconnect metal, then;

creating a via pattern in said layer of dielectric, providing openings to said preceding patterned layer of interconnect metal, whereby at least one via of said via pattern aligns with at least one via of a preceding via pattern, then;

depositing a layer of interconnect metal over said layer of dielectric, contacting said preceding patterned layer of interconnect metal through the via pattern in said layer of dielectric, and then;

patterning said layer of interconnect metal, completing said creation of a following patterned layer of interconnect metal.

9. The method of claim 8 wherein at least one of said multiplicity of patterned layers of interconnect metal is created using thin film technology.

10. The method of claim 8 wherein at least one of said multiplicity of patterned layers of interconnect metal is created using Build Up Multilayer (BUM) technology.

11. The method of claim 8 wherein at least one of said multiplicity of patterned layers of interconnect metal is created using lamination technology followed by photo masking and wet steps.

12. A method of creating an interconnect substrate overlying a metal panel, said interconnect substrate having a first and a second surface, said interconnect substrate comprising a first and a second patterned layer of interconnect metal, whereby semiconductor devices and Ball Grid Array contact balls are attached to said first surface of said interconnect substrate, comprising the steps of:

providing a metal panel said metal panel having a first surface and a second surface, said second surface of said interconnect substrate making contact with said first surface of said metal panel;

providing at least one semiconductor device, said at least one semiconductor device being provided with metal bumps for semiconductor device interconnect;

cleaning said first surface of said metal panel;

creating a first patterned layer of interconnect metal comprising a first layer of interconnect lines and contact pads by depositing a first layer of dielectric over said first surface of said metal panel, then;

creating a first via pattern in said first layer of dielectric, providing openings to said first surface of said metal panel, then;

depositing a first layer of interconnect metal over said first layer of dielectric, contacting said first surface of said metal panel through the via pattern in said first layer of dielectric, then;

patterning said first layer of interconnect metal, completing said creation of a first layer of interconnect metal;

creating a second patterned layer of interconnect metal comprising a second layer of interconnect lines and contact pads by depositing a second layer of dielectric over said first layer of dielectric, including said first patterned layer of interconnect metal, then;

creating a second via pattern in said second layer of dielectric, providing openings to said first patterned layer of interconnect metal, whereby at least one via of said second via pattern aligns with at least one via of said first via pattern forming at least one pair of contacting vias, whereby said at least one via in said first via pattern of said at least one pair of contacting vias is in contact said metal panel, then;

depositing a second layer of interconnect metal over the surface of said second layer of dielectric, contacting said contact pads in said first layer of interconnect lines through the via pattern in said second layer of dielectric, then; patterning said second layer of interconnect metal, completing said creation of a second layer of interconnect metal;

depositing a third layer of dielectric as a solder mask;

subdividing said metal substrate into individual substrates;

connecting at least one of said semiconductor devices to said points of electrical access to said patterned second layer of interconnect metal by means of metal bumps provide on said semiconductor devices by solder reflow or by other means of bumps to metal contact pad attachment;

filling space between said at least one semiconductor device and said second layer of dielectric with dielectric material by an underfill step;

providing Ball Grid Array contact balls; and attaching said Ball Grid Array contact balls to said interconnect substrate by solder reflow or by other means of bumps to metal contact pad attachment, whereby at least one of said Ball Grid Array contact balls makes contact with at least one of said pairs of contacting vias.

13. The method of claim 12 wherein said contact between said at least one of said pairs of contacting vias and at least one of said flip chip bumps or at least one of said Ball Grid Array contact balls is centered with respect to said pair of contacting vias that contacts said flip chip bump or Ball Grid Array ball.

14. The method of claim 12 wherein said contact between said at least one of said pairs of contacting vias and at least one of said flip chip bumps or at least one of said Ball Grid Array contact balls is not centered with respect said pair of contacting vias that contacts said flip chip bump or Ball Grid Array ball.

15. The method of claim 12 wherein said points of electrical access to said patterned second layer of interconnect metal are plated using solder as a source.

16. The method of claim 12 wherein said points of electrical access to said patterned second layer of interconnect metal are plated using Ni/Au as a source.

17. The method of claim 12 wherein said semiconductor devices are flip chip devices.

18. The method of claim 12 whereby said method of creating a first and a second patterned layer of interconnect metal is extended to creating a multiplicity of patterned layers of interconnect metal, said multiplicity of patterned layers of interconnect metal to comprise a multiplicity of preceding and following patterned layers of interconnect metal, whereby a following patterned layer of interconnect metal is created over a preceding patterned layer of interconnect metal, comnprising the steps of:

creating a patterned layer of interconnect metal comprising a layer of interconnect lines and contact pads by depositing a layer of dielectric over a preceding patterned layer of interconnect metal, then;

creating a via pattern in said layer of dielectric, providing openings to said preceding patterned layer of interconnect metal, then;

depositing a layer of interconnect metal over said layer of dielectric, contacting said preceding patterned layer of interconnect metal through the via pattern in said layer of dielectric, and then;

patterning said layer of interconnect metal, completing said creation of a following patterned layer of interconnect metal.

19. The method of claim 18 wherein at least one of said multiplicity of patterned layers of interconnect metal is created using thin film technology.

20. The method of claim 18 wherein at least one of said multiplicity of patterned layers of interconnect metal is created using Build Up Multilayer (BUM) technology.

21. The method of claim 18 wherein at least one of said multiplicity of patterned layers of interconnect metal is created using lamination technology followed by photo masking and wet steps.

22. A method of creating an interconnect substrate overlying a metal panel, said interconnect substrate having a first and a second surface, said interconnect substrate comprising a first and a second patterned layer of interconnect metal, whereby semiconductor devices and Ball Grid Array contact balls are attached to said first surface of said interconnect substrate, comprising the steps of:

providing a metal panel said metal panel having a first surface and a second surface, said second surface of said interconnect substrate making contact with said first surface of said metal panel;

providing at least one semiconductor device, said at least one semiconductor device being provided with metal bumps for semiconductor device interconnect;

cleaning said first surface of said metal panel;

coating a first layer of dielectric over the first surface of said metal panel;

depositing a first layer of copper foil on the surface of the first layer of dielectric, using methods of laminating or plating;

creating interconnection lines and first via openings in the first copper foil using methods of masking and etching;

coating a second layer of dielectric of the surface of the first layer of dielectric;

depositing a second layer of copper foil on the surface of the second layer of dielectric, using methods of laminating or plating;

creating second via openings in the second copper foil using methods of masking and etching, said second via openings aligning with said first via openings created in said first copper foil and at least one additional second via opening on top of the first copper foil where there is no first via opening;

drilling holes using laser drill technology through the second or through the second and the first layer of dielectric, said holes aligning with the first and the second via holes, partially exposing the first vias, further partially exposing the surface of the metal panel where holes are drilled that penetrate the second and the first layers of dielectric;

plating metal over inside surfaces of the holes created in the second or in the second and the first layer of dielectric;

patterning and etching the plated metal, creating interconnect lines and contact vias on the surface of the second layer of dielectric;

depositing a third layer of dielectric over the surface of said second layer of dielectric, including said second patterned layer of interconnect metal;

creating a third via pattern in said third layer of dielectric, providing openings to said contact vias in said second patterned layer of interconnect metal, whereby said third layer of dielectric serves as a solder mask, providing points of electrical access to said second patterned layer of interconnect metal for semiconductor device bumps and for Ball Grid Array contact balls;

subdividing said metal substrate into individual substrates;

connecting at least one of said semiconductor devices to points of electrical access provided in said second patterned layer of interconnect metal by means of metal bumps provided on said semiconductor devices using methods of solder reflow or by other means of bumps to metal contact pad attachment;

filling space between said at least one semiconductor device and said third layer of dielectric with dielectric material by an underfill step;

providing Ball Grid Array contact balls; and attaching said Ball Grid Array contact balls to said first surface of said interconnect substrate by solder reflow or by other means of bumps to metal contact pad attachment.

23. The method of claim 22 wherein said interconnect lines and contact vias on the surface of the second layer of dielectric are plated using solder as a source.

24. The method of claim 22 wherein said interconnect lines and contact vias on the surface of the second layer of dielectric metal are plated using Ni/Au as a source.

25. The method of claim 22 wherein said semiconductor devices are flip chip devices.

26. The method of claim 22 whereby said method of creating interconnect lines and contact vias on the surface of the second layer of dielectric is extended to creating interconnect lines and contact vias on the surface of a multiplicity of layers of dielectric, said multiplicity of layers of dielectric comprising a first and a last layer of dielectric between which said multiplicity of layers of dielectric are deposited, comprising the steps of:

providing a metal panel, said metal panel having a first surface and a second surface, said second surface of said interconnect substrate making contact with said first surface of said metal panel;

providing at least one semiconductor device, said at least one semiconductor device being provided with metal bumps for semiconductor device interconnect;

cleaning said first surface of said metal panel;

depositing a first layer of dielectric over the first surface of said metal panel;

creating a first patterned layer of interconnect metal on the surface of said first layer of dielectric comprising a layer of interconnect lines and contact vias;

repeating said step of depositing a layer of dielectric followed by said step of creating a patterned layer of interconnect metal on the surface of said layer of dielectric, said repetition being terminated after said multiplicity of layers of dielectric have been deposited and have been provided with a multiplicity of patterned layers of interconnect metal on the surface of each layer of said multiplicity of layers of dielectric, contact vias of said multiplicity of patterned layers of interconnect metal being aligned with said contact vias of said first patterned layer of interconnect metal;

depositing said last layer of dielectric over the surface of said multiplicity of layer of dielectric;

creating a last patterned layer of interconnect metal on the surface of said last layer of dielectric comprising a layer of interconnect lines and contact vias, contact vias of said last patterned layer of interconnect metal being aligned with said contact vias of said multiplicity of patterned layer of interconnect metal;

drilling holes using laser drill technology through at least one layer of said multiplicity of layers of dielectric, said holes being aligned with said contact vias provided on the surface of said last layer of dielectric, partially exposing at least one of said contact vias created on the surface of said multiplicity of layers of dielectric, further partially exposing the surface of the metal panel by holes being drilled penetrating said last, multiplicity and first layers of dielectric;

plating metal over inside surfaces of the holes created in said at least one hole drilled in said multiplicity of layers of dielectric;

patterning and etching the plated metal, creating interconnect lines and contact vias on the surface of the last layer of dielectric;

depositing a final layer of dielectric over the surface of said last layer of dielectric, including said patterned layer of interconnect metal created on the surface of said last layer of dielectric, said final layer of dielectric being said first surface of said interconnect substrate;

creating a final via pattern in said final layer of dielectric, providing openings to said contact vias on the surface of the last layer of dielectric, said final layer of dielectric serving as a solder mask, providing points of electrical access to said contact vias on the surface of the last layer of dielectric for semiconductor device bumps and for Ball Grid Array contact balls;

subdividing said metal substrate into individual substrates;

connecting at least one of said semiconductor devices to said points of electrical access to said contact vias on the surface of the last layer of dielectric by means of metal bumps provided on said semiconductor devices by solder reflow or by other means of bumps to metal contact pad attachment;

filling space between said at least one semiconductor device and said final layer of dielectric with dielectric material by an underfill step;

providing Ball Grid Array contact balls; and attaching said Ball Grid Array contact balls to said first surface of said interconnect substrate by solder reflow or by other means of bumps to metal contact pad attachment.

* * * * *